United States Patent
Chen et al.

(10) Patent No.: US 10,312,080 B2
(45) Date of Patent: Jun. 4, 2019

(54) METHOD FOR FORMING AMORPHOUS SILICON MULTUPLE LAYER STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Mei-Ling Chen, Kaohsiung (TW); Wei-Hsin Liu, Changhua County (TW); Yi-Wei Chen, Taichung (TW); Ching-Hsiang Chang, Tainan (TW); Jui-Min Lee, Taichung (TW); Chia-Lung Chang, Tainan (TW); Tzu-Chin Wu, Chiayi County (TW); Shih-Fang Tzou, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/859,750

(22) Filed: Jan. 2, 2018

(65) Prior Publication Data
US 2018/0190488 A1 Jul. 5, 2018

(30) Foreign Application Priority Data
Jan. 3, 2017 (CN) .......................... 2017 1 0002081

(51) Int. Cl.
*H01L 21/02* (2006.01)

(52) U.S. Cl.
CPC .... *H01L 21/02532* (2013.01); *H01L 21/0262* (2013.01); *H01L 21/02422* (2013.01); *H01L 21/02592* (2013.01); *H01L 21/02664* (2013.01)

(58) Field of Classification Search
None
See application file for complete search history.

(56) References Cited

U.S. PATENT DOCUMENTS

| | | | |
|---|---|---|---|
| 4,571,348 A | 2/1986 | Troxell | |
| 6,190,949 B1* | 2/2001 | Noguchi | B82Y 10/00 438/487 |
| 7,091,411 B2* | 8/2006 | Falk | H01L 31/02246 438/97 |
| 7,314,513 B1* | 1/2008 | Zurcher | H01L 21/02532 106/287.14 |
| 2011/0159669 A1 | 6/2011 | Yang | |
| 2012/0193796 A1 | 8/2012 | Lin | |

* cited by examiner

*Primary Examiner* — Chandra Chaudhari
(74) *Attorney, Agent, or Firm* — Winston Hsu

(57) ABSTRACT

The present invention provides a method for forming an amorphous silicon multiple layer structure, the method comprises the flowing steps: first, a substrate material layer is provided, next, a first amorphous silicon layer is formed on the substrate material layer, wherein the first amorphous silicon layer includes a plurality of hydrogen atoms disposed therein, afterwards, an UV curing process is performed to the first amorphous silicon layer, so as to remove the hydrogen atoms from the first amorphous silicon layer, finally, a second amorphous silicon layer is formed on the first amorphous silicon layer.

13 Claims, 2 Drawing Sheets

METHOD FOR FORMING AMORPHOUS SILICON MULTUPLE LAYER STRUCTURE

BACKGROUND OF THE INVENTION

1. Field of the Invention

The present invention relates to the field of semiconductors, and more particularly to a method for improving bubble defects during the formation of an amorphous silicon multilayer structure.

2. Description of the Prior Art

Amorphous silicon is a main material used in various electronic components such as solar cells, thin film transistors, image sensors, or micro-electromechanical systems. In the fabrication of these electronic components, the step of depositing the amorphous silicon thin film is typically performed on a substrate after depositing or patterning the thin film. Amorphous silicon films are typically deposited by chemical vapor deposition (CVD), such as plasma-enhanced CVD (PECVD).

FIG. 1 shows a schematic diagram of a bubble defect generation. First, a nitrogen-containing material layer 10, for example, a silicon nitride ($Si_3N_4$) or a silicon nitride (SiCN) material layer is provided, followed by a PECVD step P0 is performed to deposit an amorphous silicon layer 12 on the nitrogen-containing material layer 10.

Applicants found that when depositing the amorphous silicon layer 12 on the nitrogen-containing material layer 10 by PECVD or the like, since PECVD will be deposited using $SiH_4$ gas, and the $SiH_4$ gas will react with nitrogen in the nitrogen-containing material layer (such as SiCN) to produce a bond of SiCN:H. In other words, part of the hydrogen atoms will enter into the nitrogen-containing material layer 10. The hydrogen atoms are continuously released from the nitrogen-containing material layer while amorphous silicon is being deposited. Therefore, the deposited amorphous silicon layer is affected by the hydrogen gas from below and causes many defects in the surface of the amorphous silicon layer 12. For example, many raised portions have been formed, and therefore the amorphous silicon layer 12 has an uneven surface 12a, which is referred to herein as a bubble defect.

The above-mentioned bubble defect affects the surface flatness of the entire amorphous silicon layer, and further influences to the yield of the overall process. Therefore, how to solve the above-mentioned problem of bubble defects is one of the objectives of the present invention.

SUMMARY OF THE INVENTION

The present invention provides a method for forming an amorphous silicon multiple layer structure, the method comprises the flowing steps: first, a substrate material layer is provided, next, a first amorphous silicon layer is formed on the substrate material layer, wherein the first amorphous silicon layer includes a plurality of hydrogen atoms disposed therein, afterwards, an UV curing process is performed to the first amorphous silicon layer, so as to remove the hydrogen atoms from the first amorphous silicon layer, finally, a second amorphous silicon layer is formed on the first amorphous silicon layer.

The present invention provides a method of forming an amorphous silicon multi-layer structure, and more particularly, a method for improving bubble defect during the formation of a multi-layers amorphous silicon structure. One feature is that a thinner (less than about 300 angstroms) amorphous silicon layer is firstly formed on the nitrogen-containing material layer and then an ultraviolet (UV) curing step is performed to remove the hydrogen atoms from the nitrogen-containing material layer and the amorphous silicon layer. After the hydrogen atoms are removed, hydrogen gas will not form in subsequent deposition steps, and will not affect the surface of the amorphous silicon, reducing the possibility of bubble defect occurring. The present invention can be applied to various semiconductor processes and improves the overall process yield.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
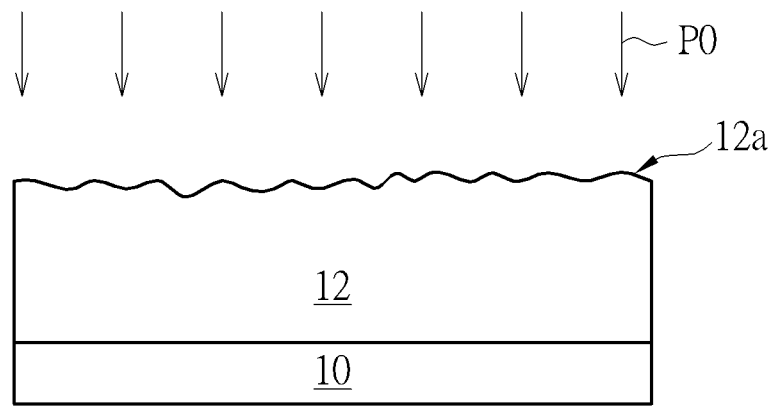
FIG. 1 shows a schematic diagram of a bubble defect generation.
Figure 2:
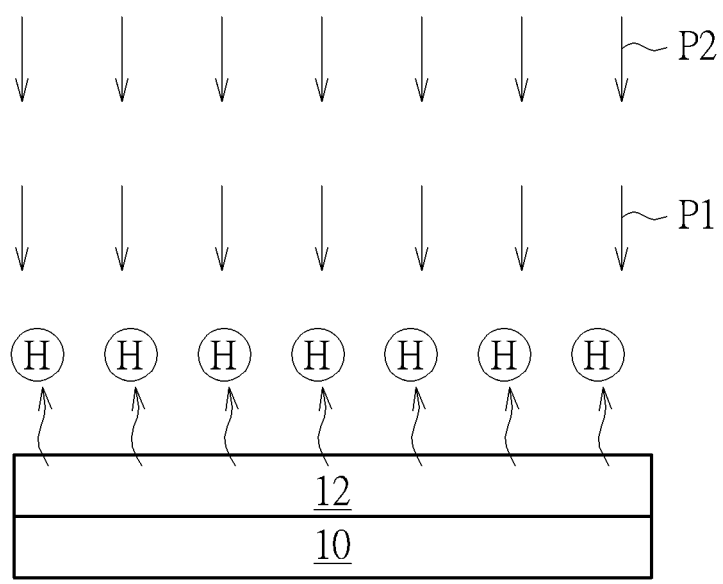
FIG. 2 to FIG. 4 illustrate the structure of an amorphous silicon multilayer structure according to the first preferred embodiment of the present invention.
Figure 3:
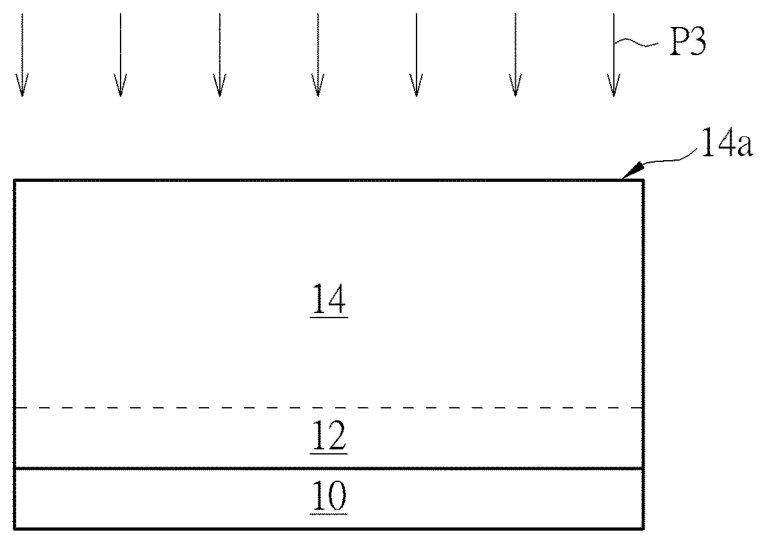
Figure 4:
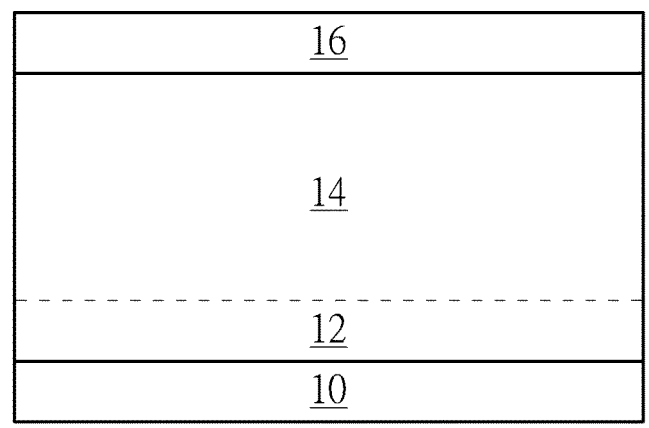

Please refer to FIG. 2 to FIG. 4, which illustrate the structure of an amorphous silicon multilayer structure according to the first preferred embodiment of the present invention. As shown in FIG. 2, a nitrogen-containing material layer 10 is provided, the nitrogen-containing material layer 10 includes such as a silicon nitride layer or a silicon nitride layer, but the present invention is not limited thereto. Next, a first PECVD step P1 is performed to deposit a first amorphous silicon layer 12 on the nitrogen-containing material layer 10. In the first PECVD step P1, in order to deposit amorphous silicon, it is necessary to carry out the process together with a silicon-containing gas. For example, monosilane ($SiH_4$), $Si_2H_6$, $Si_3H_8$ and the like. In this embodiment, $SiH_4$ is taken as an example, but not limited thereto.

As mentioned in the prior art, while amorphous silicon is deposited, the hydrogen atoms contained in the $SiH_4$ gas will gradually enter into the underlying nitrogen-containing material layer 10 to form a bond with the nitrogen-containing material layer 10. Therefore, in the present embodiment, the thickness of the deposited first amorphous silicon layer 12 will be controlled to about 300 angstroms or less, compared with the conventional amorphous silicon layer thickness (about 1 micrometer or more), the thickness of the first amorphous silicon layer 12 is relatively thin, only about 1/30 of the thickness of the finally deposited amorphous silicon layer. The purpose is to control and make fewer hydrogen atoms into the nitrogen-containing material layer 10. Next, an ultraviolet (UV) curing step P2 is performed. In this embodiment, the process temperature of the ultraviolet curing step P2 is preferably between 300 and 600° C., the process pressure is preferably less than 10 torr, and the execution time is preferably less than 5 minute. However, the above experimental parameters may be adjusted according to actual requirements, and the present invention is not limited thereto. In addition, the UV curing step P2 can be selected in an in situ UV curing step or an ex situ UV curing step. The in situ UV curing step means that the UV curing step and the deposition of amorphous silicon step using the same machine, but are carried out in different chamber. And the ex situ UV curing step means that the UV curing step and the step of depositing amorphous silicon are performed using different machines. The above process steps are within the scope of the present invention.

The applicant has found that after the ultraviolet curing step P2, as shown in FIG. 2, the hydrogen atoms H located inside the nitrogen-containing material layer 10 can be effectively dissipated, in other words, the hydrogen atoms H inside the nitrogen-containing material layer 10 can be removed. Since the first amorphous silicon layer 12 is thin (less than 300 angstroms), the ultraviolet curing step P2 can effectively affect the nitrogen-containing material layer 10, and after the UV curing step P2, a protective layer will be formed on the first amorphous silicon layer 12, which is used to isolate the nitrogen-containing material layer 10 from directly contacts the subsequent $SiH_4$ gas. Therefore, in other embodiments, if the thickness of the first amorphous silicon layer 12 is thicker (more than 300 angstroms), the effect of performing the ultraviolet curing step P2 may be reduced, it may result in the hydrogen atoms is eliminated incompletely or it may take more time to eliminate hydrogen atoms.

After the ultraviolet curing step P2 is performed, since the first amorphous silicon layer 12 has become a protective layer that isolates the underlying nitrogen-containing material layer 10, the amorphous silicon layer can be subsequently deposited to a sufficient height. As shown in FIG. 3, a second PECVD step P3 is performed to form a second amorphous silicon layer 14 on the first amorphous silicon layer 12. The second amorphous silicon layer 14 may comprise a single layer or a multilayer structure with a thickness of at least more than 1 micrometers. In more detail, the second amorphous silicon layer 14 may be formed by a single PECVD step at a time, or a multi-layered amorphous silicon layer may be gradually formed by multiple repeated PECVD steps. In addition, after each portion of the amorphous silicon layer is deposited, an additional UV curing step is performed to expedite exclusion of hydrogen atoms. However, since the main influence of hydrogen atoms is on the nitrogen-containing material layer 10, the subsequent ultraviolet curing step may be omitted while the nitrogen-containing material layer 10 has been isolated by the first amorphous silicon layer 12.

After the second amorphous silicon layer 14 is deposited to a sufficient height, since the occurrence of bubble defects has been solved, the second amorphous silicon layer 14 has a flat top surface 14a. Next, as shown in FIG. 4, a mask layer 16 may be selectively formed on the second amorphous silicon layer 14, such as a silicon oxide layer, but not limited thereto. Until this step, the amorphous silicon multilayer structure of the present invention has been completed. The amorphous silicon multilayer structure can be applied to the fabrication of various semiconductor devices, for example, the it can be used as a mask layer of a DRAM (dynamic random access memory), or be used as the gate material layer for transistors, etc., the present invention is not limited thereto.

In summary, the present invention provides a method of forming an amorphous silicon multi-layer structure, and more particularly, a method for improving bubble defect during the formation of a multi-layers amorphous silicon structure. One feature is that a thinner (less than about 300 angstroms) amorphous silicon layer is firstly formed on the nitrogen-containing material layer and then an ultraviolet (UV) curing step is performed to remove the hydrogen atoms from the nitrogen-containing material layer and the amorphous silicon layer. After the hydrogen atoms are removed, hydrogen gas will not form in subsequent deposition steps, and will not affect the surface of the amorphous silicon, reducing the possibility of bubble defect occurring. The present invention can be applied to various semiconductor processes and improves the overall process yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming an amorphous silicon multiple layer structure, comprising:
   providing a nitrogen-containing material layer;
   forming a first amorphous silicon layer on the nitrogen-containing material layer, wherein the first amorphous silicon layer comprises a plurality of hydrogen atoms disposed therein, and wherein the hydrogen atoms gas enters into the nitrogen-containing material layer gradually after the first amorphous silicon layer is formed;
   performing an ultraviolet (UV) curing step to the first amorphous silicon layer, so as to remove the hydrogen atoms from the first amorphous silicon layer and the nitrogen-containing material layer; and
   forming a second amorphous silicon layer on the first amorphous silicon layer.

2. The method of claim 1, wherein a thickness of the first amorphous silicon layer is less than 300 angstroms.

3. The method of claim 1, further comprising forming a mask layer on the second amorphous silicon layer.

4. The method of claim 1, wherein the UV curing step is an in-situ UV curing step.

5. The method of claim 1, wherein the UV curing step is an ex situ UV curing step.

6. The method of claim 1, wherein the material of the nitrogen-containing material layer comprises silicon nitride or silicon carbon nitride.

7. The method of claim 1, further comprising forming a plurality of amorphous silicon layers on the second amorphous silicon layer.

8. The method of claim 1, wherein the second amorphous silicon layer has a flat surface.

9. The method of claim 1, wherein the temperature of the UV curing step is between 300° C.-600° C.

10. The method of claim 1, wherein the pressure of the UV curing step is less than 10 torr.

11. The method of claim 1, wherein time of the UV curing step is less than 5 minutes.

12. The method of claim 1, wherein the first amorphous silicon layer and the second amorphous silicon layer are formed by a plasma enhanced chemical vapor deposition (PECVD) method.

13. The method of claim 1, wherein the PECVD deposition gas comprises monosilane ($SiH_4$).

\* \* \* \* \*